US008834155B2

(12) United States Patent
Li et al.

(10) Patent No.: US 8,834,155 B2
(45) Date of Patent: Sep. 16, 2014

(54) WAFER TRANSFER APPARATUS AND WAFER TRANSFER METHOD

(75) Inventors: Chunlong Li, Beijing (CN); Junfeng Li, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 571 days.

(21) Appl. No.: 13/140,471

(22) PCT Filed: Apr. 11, 2011

(86) PCT No.: PCT/CN2011/072592
§ 371 (c)(1),
(2), (4) Date: Jun. 17, 2011

(87) PCT Pub. No.: WO2012/129820
PCT Pub. Date: Oct. 4, 2012

(65) Prior Publication Data
US 2012/0247723 A1    Oct. 4, 2012

(30) Foreign Application Priority Data

Mar. 29, 2011  (CN) .......................... 2011 1 0077731

(51) Int. Cl.
| | |
|---|---|
| *F27D 15/02* | (2006.01) |
| *H01L 21/677* | (2006.01) |
| *H01L 21/67* | (2006.01) |

(52) U.S. Cl.
CPC .... *H01L 21/67766* (2013.01); *H01L 21/67778* (2013.01); *H01L 21/67109* (2013.01)
USPC ................................................ 432/81; 432/4

(58) Field of Classification Search
USPC ........ 432/4, 253, 258, 259, 81; 414/937, 939, 414/940
See application file for complete search history.

(56) References Cited

U.S. PATENT DOCUMENTS

| | | | |
|---|---|---|---|
| 5,746,512 A | 5/1998 | Yao et al. | |
| 6,276,072 B1 * | 8/2001 | Morad et al. | 34/428 |
| 6,357,143 B2 * | 3/2002 | Morad et al. | 34/412 |
| 6,435,868 B2 * | 8/2002 | White et al. | 432/247 |
| 6,575,737 B1 * | 6/2003 | Perlov et al. | 432/81 |
| 6,929,774 B2 * | 8/2005 | Morad et al. | 266/81 |
| 7,780,438 B2 * | 8/2010 | Hayashi et al. | 432/81 |
| 8,061,949 B2 * | 11/2011 | Kurita et al. | 414/217 |

(Continued)

FOREIGN PATENT DOCUMENTS

| | | |
|---|---|---|
| CN | 185536 A | 11/2006 |
| JP | 309595 A | 4/1991 |

OTHER PUBLICATIONS

PCT International Search Report (Dec. 29, 2011).
Written Opinion (Dec. 29, 2011).

*Primary Examiner* — Gregory A Wilson
(74) *Attorney, Agent, or Firm* — Goodwin Procter LLP

(57) ABSTRACT

A water transfer apparatus and a wafer transfer method are provided. The wafer transfer apparatus is provided with a heating component and a cooling component, the heating component heats the wafer carrying component to a temperature the same as the wafer when it is just unloaded from the rapid thermal anneal tool, and the cooling component cools the wafer carrying component along with the wafer to room temperature, thereby avoiding the large temperature difference between the wafer and the wafer transfer apparatus, preventing the high thermal stress induced inside the wafer during wafer transfer, avoiding wafer breakage, and ensuring the completeness of the wafer.

4 Claims, 1 Drawing Sheet

(56) References Cited

U.S. PATENT DOCUMENTS

| | | | |
|---|---|---|---|
| 2005/0006230 A1* | 1/2005 | Narushima et al. | 204/298.2 |
| 2006/0242967 A1 | 11/2006 | Lin et al. | |
| 2008/0171435 A1* | 7/2008 | Fujii et al. | 438/680 |
| 2010/0111648 A1* | 5/2010 | Tamura et al. | 414/217 |
| 2010/0139889 A1* | 6/2010 | Kurita et al. | 165/80.5 |
| 2012/0034570 A1* | 2/2012 | Yasui et al. | 432/1 |

* cited by examiner

WAFER TRANSFER APPARATUS AND WAFER TRANSFER METHOD

CROSS-REFERENCE TO RELATED APPLICATION

This application is a Section 371 national stage application of International Application No. PCT/CN2011/072592 filed on Apr. 11, 2011, which claims priority to CN201110077731.2 filed on Mar. 29, 2011, the contents of which are incorporated herein by reference in their entirety.

FIELD OF THE INVENTION

The present invention relates to the field of semiconductor fabrication, and in particular to a wafer transfer apparatus and a wafer transfer method.

BACKGROUND OF THE INVENTION

Rapid thermal anneal (RTA) is a common process in semiconductor fabrication. When rapid thermal anneal process is over, wafers are unloaded from the rapid thermal anneal tool to be transferred to other processing tools. At this point of time, the wafers are at a high temperature, e.g., 300° C. However the wafer carrier of the wafer transfer equipment is at room temperature, resulting in a large temperature difference between the wafer and the wafer transfer equipment, which may induce a high thermal stress inside the wafer, reduce its mechanical strength, and even cause the wafer to break. The case is worse in production lines for large-size wafers, e.g., the world's largest 12-inch wafers, or further 16-inch wafers.

Therefore, new wafer transfer equipment and wafer transfer method are desired, to reduce the temperature difference between the wafer and the transfer equipment, and decrease the thermal stress inside the wafer, thereby ensuring the completeness of the wafer.

SUMMARY OF THE INVENTION

The present invention provides a wafer transfer apparatus and a wafer transfer method, according to which a wafer transfer apparatus with a heating component and a cooling component is used to transfer the wafer, resulting in reduced temperature difference between the wafer and the transfer equipment, and decreased thermal stress inside the wafer, thereby ensuring the completeness of the wafer.

The present invention provides a wafer transfer apparatus for transferring a wafer unloaded from a rapid thermal anneal tool, the wafer being at a first temperature at the time when it is unloaded from the rapid thermal anneal tool, the wafer transfer apparatus including a wafer carrying component, a heating component and a cooling component, wherein the heating component is adapted to heat the wafer carrying component to the first temperature, and the cooling component is adapted to cool the wafer carrying component to room temperature.

The present invention also provides a wafer transfer method, including transferring a wafer unloaded from a rapid thermal anneal tool by a wafer transfer apparatus, the wafer being at a first temperature at the time when it is unloaded from the rapid thermal anneal tool, the wafer transfer apparatus including a wafer carrying component, a heating component and a cooling component, wherein the method further includes: before the transferring of the wafer, heating, by the heating component, the wafer carrying component to the first temperature; arranging, the wafer unloaded from the rapid thermal anneal tool, directly on the wafer carrying component; and cooling, by the cooling component, the wafer carrying component and the wafer to room temperature.

In the method according to the present invention, the first temperature may be not less than 300° C.

In the method according to the present invention, the cooling of the wafer carrying component and the wafer to room temperature by the cooling component may be at a rate of 20° C./s.

In the method according to the present invention, the cooling of the wafer carrying component and the wafer to room temperature by the cooling component may be at a rate not higher than 40° C./s.

The present invention has the advantages that: the wafer transfer apparatus is provided with a heating component and a cooling component, the heating component heats the wafer carrying component to a temperature the same as the wafer when it is just unloaded from the rapid thermal anneal tool, and the cooling component cools the wafer carrying component along with the wafer to room temperature, thereby avoiding the large temperature difference between the wafer and the wafer transfer apparatus, preventing the high thermal stress induced inside the wafer during wafer transfer, avoiding wafer breakage, and ensuring the completeness of the wafer.

DETAILED DESCRIPTION OF THE INVENTION

Technical features and effects of the technical solution of the invention will be described in details hereinafter with reference to the accompanying drawings in connection with the exemplary embodiments.

The invention provides a wafer transfer apparatus, for transferring a wafer unloaded from a rapid thermal anneal tool. The wafer is at a first temperature at the time when it is unloaded from the rapid thermal anneal tool, and the first temperature is not less than 300° C. The wafer transfer apparatus includes: a wafer carrying component, a heating component, and a cooling component. The wafer carrying component is adapted to carry the wafer unloaded; the heating component is adapted to heat the wafer carrying component, to the first temperature; and the cooling component is adapted to cool the water carrying component, from the first temperature to room temperature.

Figure 1:
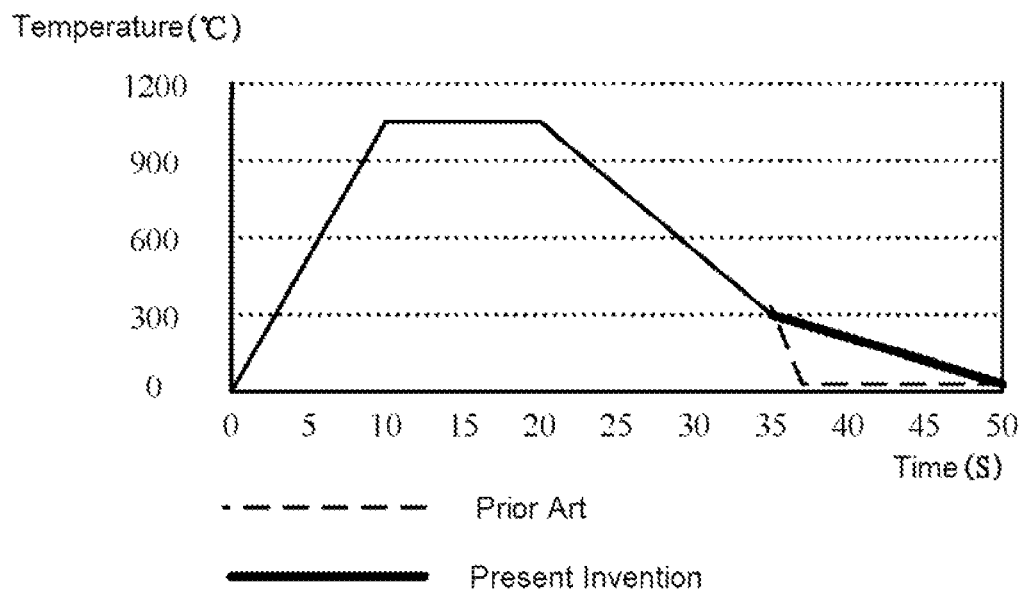
FIG. 1 illustrates temperature-time curves during rapid thermal anneal and wafer transfer.
Figure 2:
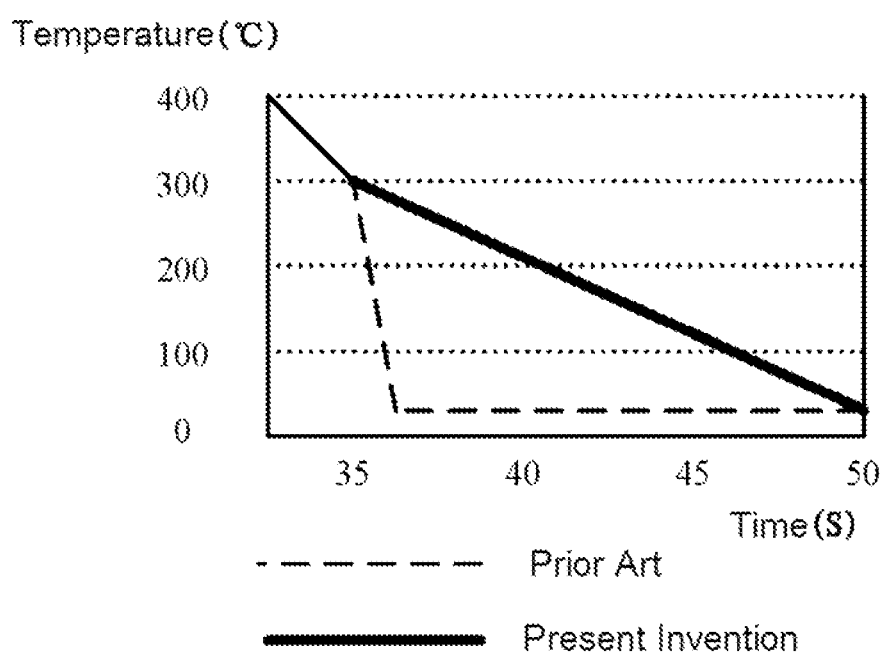
FIG. 2 illustrates temperature-time curves during wafer transfer.

The invention also provides a wafer transfer method, in which a wafer transfer apparatus is used to transfer a wafer unloaded from a rapid thermal anneal tool. Now refer to FIG. 1, which illustrates temperature-time curves during rapid thermal anneal and wafer transfer. First, the wafer is placed in a rapid thermal anneal tool. For example, the rapid thermal anneal tool brings up the temperature to around 1100° C. at the temperature increasing stage: 0-10 s, maintains it for about 10 s, and performs rapid thermal anneal; next, when the rapid thermal anneal is over, the wafer is transferred to a box for subsequent processing, e.g. a FOUP (Front Open Unified Pod). After rapid thermal anneal, the wafer is at a first temperature at the time when it is unloaded from the rapid thermal anneal tool, and the first temperature is not less than 300° C. In conventional wafer transfer methods, the wafer is placed directly on a wafer transfer apparatus which is at room temperature, resulting in a large temperature difference between the wafer and the wafer transfer apparatus, and causing the wafer temperature to drop to room temperature on a timescale of several seconds, as represented by the dash lines in FIG. 1 and FIG. 2. A high thermal stress is induced inside the wafer, which may reduce its mechanical strength and cause the wafer to break. However, in the invention, the wafer is transferred by a wafer transfer apparatus with a wafer carrying component, a heating component and a cooling component. Specifically, before transferring of the wafer, the heating component of the wafer transfer apparatus heats the wafer carrying component to the first temperature of the wafer, and the wafer unloaded from the rapid thermal anneal tool is placed directly on the water carrying component. Therefore, the wafer and the wafer carrying, component do not have a large temperature difference, the wafer temperature will not suddenly drop to room temperature in short time, and no high thermal stress is to be induced inside the wafer, thereby avoiding wafer breakage. Next, the cooling component of the wafer transfer apparatus cools the wafer carrying component along with the wafer to room temperature. The cooling by the cooling, component can be at a relatively fast rate, e.g., 20° C./s, which corresponds to a cooling time of 15 seconds. Reference is made to FIG. 2, which illustrates an enlarged portion of the cooling curves, where the thick line represents the invention. Thus, cooling time is reduced and efficiency is improved, without inducing the thermal stress inside the wafer. Moreover, in order to prevent the induced thermal stress, the cooling rate should not be too fast, e.g. not higher than 40° C./s. On the other hand, because of the heating component, the wafer carrying component can be heated to a relatively high temperature. Therefore, in wafer transfer, the invention allows the wafer unloaded from the rapid thermal anneal tool to have a relatively high temperature, e.g., 400° C. or 500° C.; and with the help of the heating component, the wafer carrying component is able to match the water temperature, thereby raising the end temperature of rapid thermal anneal, to improve the production rate of the rapid thermal anneal tool, and avoiding the thermal stress problem.

In the invention, the wafer transfer apparatus is provided with a heating component and a cooling component, the heating component heats the wafer carrying component to a temperature the same as the wafer when it is just unloaded from the rapid thermal anneal tool, and the cooling component cools the wafer carrying component along with the wafer to room temperature, thereby avoiding the large temperature difference between the wafer and the wafer transfer apparatus, preventing the high thermal stress induced inside the wafer during wafer transfer, avoiding wafer breakage, and ensuring the completeness of the wafer. Moreover, because of the heating component, the invention allows the wafer unloaded to have a high temperature; hence, the invention makes it possible to raise the end temperature of rapid thermal anneal, to improve the production rate of the rapid thermal anneal tool.

The present invention is described above in connection with the exemplary embodiments. It should be noted that a variety of alternations and equivalents may be made to the technical solution of the invention by those skilled in the art without deviation from the scope of the invention. In addition, many situation-specific and material-specific modifications can be made based on the disclosure herein. Therefore, the embodiments disclosed herein are for exemplary purpose only and should not be interpreted as limiting the scope of the invention.

The invention claimed is:

1. A wafer transfer method, comprising:
transferring a wafer unloaded from a rapid thermal anneal tool by a wafer transfer apparatus, the wafer being at a first temperature at the time when it is unloaded from the rapid thermal anneal tool, the wafer transfer apparatus comprising a wafer carrying component, a heating component and a cooling component, wherein
the heating component is adapted to heat the wafer carrying component to the first temperature, and
the cooling component is adapted to cool the wafer carrying component to room temperature;
the method further comprising:
heating, by the heating component, the wafer carrying component to the first temperature prior to the transferring of the wafer;
placing the wafer unloaded from the rapid thermal anneal tool directly on the wafer carrying component; and
cooling, by the cooling component, the wafer carrying component and the wafer to room temperature.

2. The wafer transfer method according to claim 1, the first temperature is not less than 300° C.

3. The wafer transfer method according to claim 1, the cooling of the wafer carrying component and the wafer to room temperature by the cooling component is at a rate of 20° C./s.

4. The wafer transfer method according to claim 1, the cooling of the wafer carrying component and the wafer to room temperature by the cooling component is at a rate not higher than 40° C./s.

* * * * *